US00RE48880E

(19) United States
(12) Reissued Patent
Maeda et al.

(10) Patent Number: US RE48,880 E
(45) Date of Reissued Patent: *Jan. 4, 2022

(54) LASER DIODE ARRAY, METHOD OF MANUFACTURING THE SAME, PRINTER, AND OPTICAL COMMUNICATION DEVICE

(71) Applicant: Sony Group Corporation, Tokyo (JP)

(72) Inventors: Osamu Maeda, Miyagi (JP); Masaki Shiozaki, Miyagi (JP); Takahiro Arakida, Kanagawa (JP)

(73) Assignee: Sony Group Corporation, Tokyo (JP)

( * ) Notice: This patent is subject to a terminal disclaimer.

(21) Appl. No.: 16/059,386

(22) Filed: Aug. 9, 2018

Related U.S. Patent Documents

Reissue of:
(64) Patent No.: 8,363,689
Issued: Jan. 29, 2013
Appl. No.: 13/064,218
Filed: Mar. 11, 2011

U.S. Applications:
(60) Continuation of application No. 15/193,637, filed on Jun. 27, 2016, now Pat. No. Re. 46,996, which is a
(Continued)

(30) Foreign Application Priority Data

Aug. 22, 2007 (JP) ..... 2007-216401

(51) Int. Cl.
*H01S 5/187* (2006.01)
*H01S 5/42* (2006.01)
(Continued)

(52) U.S. Cl.
CPC ..... *H01S 5/423* (2013.01); *H01S 5/0217* (2013.01); *H01S 5/0425* (2013.01); *H01S 5/187* (2013.01);
(Continued)

(58) Field of Classification Search
CPC .... H01S 5/1838; H01S 5/18341; H01S 5/423; H01S 5/0215; H01S 5/0216; H01S 5/0217; H01S 5/02272; H01S 5/0206
See application file for complete search history.

(56) References Cited

U.S. PATENT DOCUMENTS 5,557,626 A 9/1996 Grodzinski et al.
5,832,017 A 11/1998 Ramdani et al.
(Continued)

FOREIGN PATENT DOCUMENTS

JP 01-281786 A 11/1989
JP 11-274633 10/1999
(Continued)

OTHER PUBLICATIONS

Japanese Office Action dated Jan. 26, 2012 for corresponding Japanese Application No. 2007-216401.
(Continued)

*Primary Examiner* — James A Menefee
(74) *Attorney, Agent, or Firm* — Michael Best & Friedrich LLP

(57) ABSTRACT

A method of manufacturing a laser diode array capable of inhibiting electric cross talk is provided. The method of manufacturing a laser diode array includes a processing step of forming a peel layer containing an oxidizable material and a vertical resonator structure over a first substrate sequentially from the first substrate side by crystal growth, and then selectively etching the peel layer and the vertical resonator structure to the first substrate, thereby processing into a columnar shape, a peeling step of oxidizing the peel layer from a side face, and then peeling the vertical resonator structure of columnar shape from the first substrate, and a rearrangement step of jointing a plurality of vertical resonator structures of columnar shape obtained by the peeling
(Continued)

step to a surface of a metal layer of a second substrate formed with the metal layer on the surface.

7 Claims, 16 Drawing Sheets

Related U.S. Application Data continuation of application No. 14/605,715, filed on Jan. 26, 2015, now Pat. No. Re. 46,059, which is an application for the reissue of Pat. No. 8,363,689, which is a division of application No. 12/219,491, filed on Jul. 23, 2008, now Pat. No. 7,960,195.

(51) Int. Cl.

| | |
|---|---|
| ***H01S 5/02*** | (2006.01) |
| ***H01S 5/042*** | (2006.01) |
| ***H01S 5/183*** | (2006.01) |
| ***H01S 5/343*** | (2006.01) |
| *H01S 5/0237* | (2021.01) |
| *H01S 5/02345* | (2021.01) |

(52) U.S. Cl.

CPC ..... *H01S 5/1838* (2013.01); *H01S 5/18311* (2013.01); *H01S 5/18341* (2013.01); *H01S 5/34313* (2013.01); *H01L 2224/18* (2013.01); *H01L 2224/24137* (2013.01); *H01L 2224/73267* (2013.01); *H01S 5/0237* (2021.01); *H01S 5/02345* (2021.01); *H01S 5/042* (2013.01); *H01S 2304/04* (2013.01); *Y10S 438/977* (2013.01)

(56) References Cited

U.S. PATENT DOCUMENTS

| | | | | |
|---|---|---|---|---|
| 6,770,188 | B2 | 8/2004 | Suda et al. | |
| 6,913,985 | B2 | 7/2005 | Ogihara et al. | |
| 7,154,927 | B2 | 12/2006 | Otoma | |
| 7,286,584 | B2 * | 10/2007 | Wang et al. | 372/43.01 |
| 7,399,693 | B2 | 7/2008 | Sekiguchi et al. | |
| RE46,059 | E | 7/2016 | Maeda et al. | |
| RE46,996 | E * | 8/2018 | Maeda | H01S 5/18341 |
| 2004/0076209 | A1 | 4/2004 | Bour et al. | |
| 2005/0243886 | A1 * | 11/2005 | Wang et al. | 372/98 |
| 2006/0246688 | A1 | 11/2006 | Sekiguchi et al. | |
| 2007/0091952 | A1 | 4/2007 | Mukoyama et al. | |
| 2008/0156368 | A1 | 7/2008 | Hirose et al. | |
| 2009/0052490 | A1 | 2/2009 | Maeda et al. | |
| 2010/0046565 | A1 * | 2/2010 | Masui et al. | 372/45.01 |

FOREIGN PATENT DOCUMENTS

| | | | |
|---|---|---|---|
| JP | 2003-347669 | A | 12/2003 |
| JP | 2005-159071 | A | 6/2005 |
| JP | 2005-317801 | A | 11/2005 |
| JP | 2006-147874 | A | 6/2006 |
| JP | 2008-182214 | A | 8/2008 |

OTHER PUBLICATIONS

Japanese Office Action issued Jan. 26, 2012 for corresponding Japanese Application No. 2007-216401.

* cited by examiner

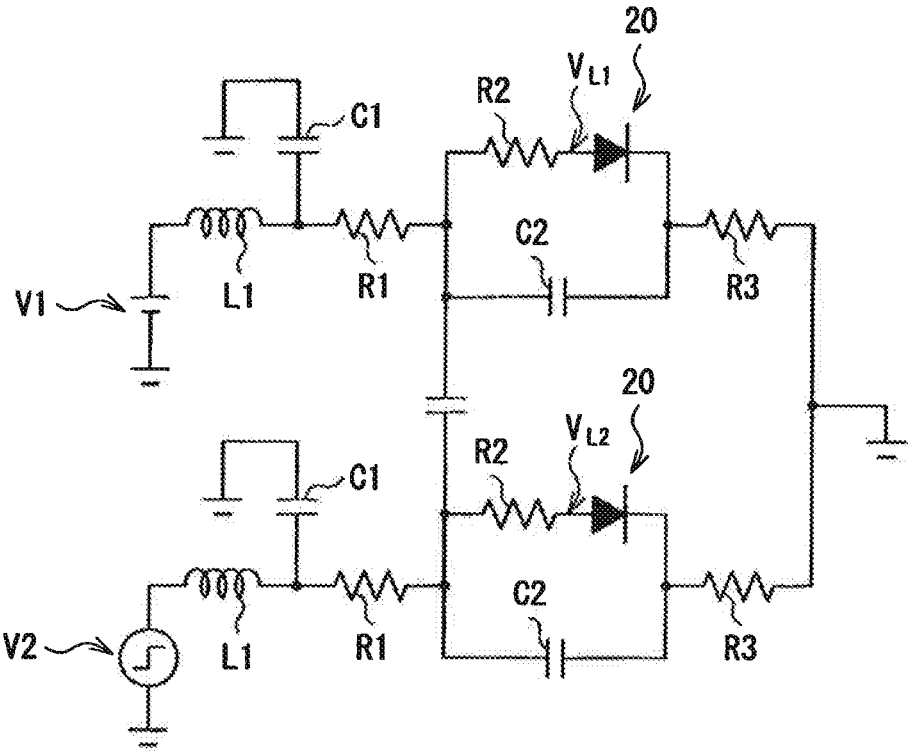
FIG. 7
FIG. 8A
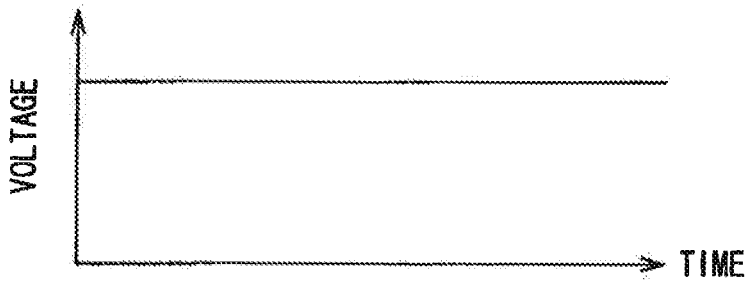
FIG. 8B
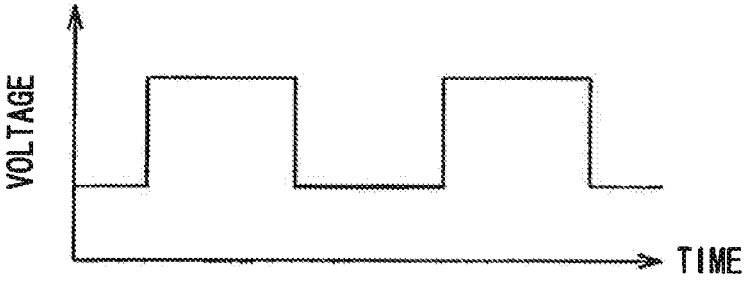

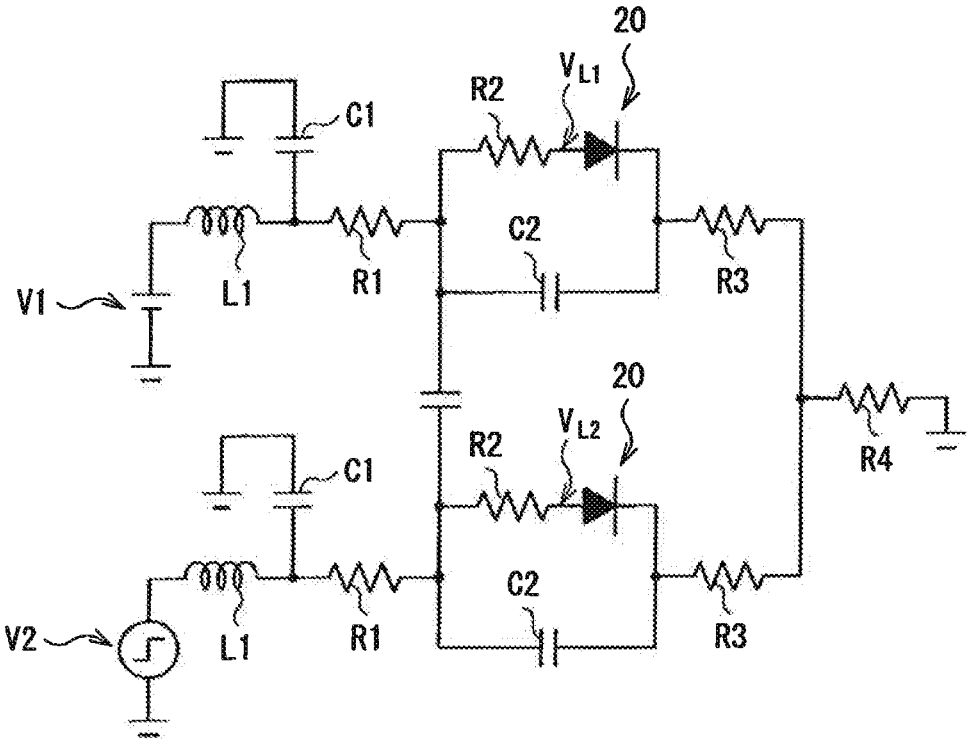
FIG. 18
FIG. 19A
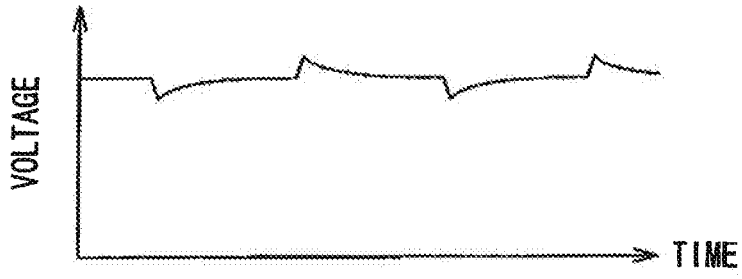
FIG. 19B
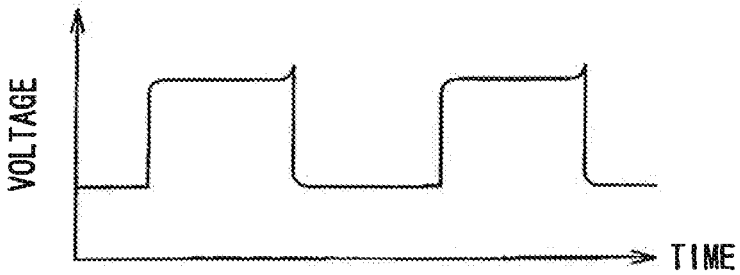

LASER DIODE ARRAY, METHOD OF MANUFACTURING THE SAME, PRINTER, AND OPTICAL COMMUNICATION DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCES TO RELATED APPLICATIONS

*Notice: More than one reissue application has been filed for the reissue of U.S. Pat. No. 8,363,689. The reissue applications are application Ser. No. 16/059,386 (the present application), application Ser. No. 14/605,715 and application Ser. No. 15/193,637, all of which are reissues of U.S. Pat. No. 8,363,689.*

This *present application is a Continuation Reissue Application of application Ser. No. 15/193,637, filed Jun. 27, 2016, now U.S. Reissue Pat. No. RE46,996, which is Continuation Reissue Application of application Ser. No. 14/605,715, filed Jan. 26, 2015, now U.S. Reissue Pat. No. RE46,059, issued Jul. 5, 2016, which is a Reissue Application of application Ser. No. 13/064,218, now U.S. Pat. No. 8,363,689, issued Jan. 29, 2013, which* is a Divisional Application of patent application Ser. No. 12/219,491, filed Jul. 23, 2008, *now U.S. Pat. No. 7,960,195, issued Jun. 14, 2011,* which claims priority from Japanese Patent Application JP 2007-216401 filed in the Japanese Patent Office on Aug. 22, 2007, the entire contents of which are incorporated herein by reference.

BACKGROUND OF THE INVENTION

1. Field of the Invention

The present invention relates to a laser diode array including a columnar vertical resonator structure, a method of manufacturing the same, a printer including the laser diode array, and an optical communication device including the laser diode array.

2. Description of the Related Art

In recent years, in the field of laser diodes (LD), a laser array in which a plurality of Vertical Cavity Surface Emitting Lasers (VCSEL) is formed on the same substrate has been actively developed. The laser array is used as a light source for an optical communication device, a laser printer and the like.

In the field of optical communication devices, the laser printers and the like, because of downsizing, it has been desired to propagate laser light emitted from each laser diode formed on the same substrate by a single optical system. However, when the distance between each laser diode is reduced, cross talk due to heat generated from each laser diode and current leaked from each laser diode becomes significant. As a result, interference, color blur and the like occur.

Therefore, for example, in Japanese Unexamined Patent Application Publication No. 11-274633, a technique in which a groove is provided between each laser diode and a terminal section is provided on the both ends of the groove has been proposed. In the application, the following is represented. That is, a path to conduct generated heat to a region other than an adjacent laser diode is secured, and in addition to that a heat conduction path to the adjacent laser diode is blocked. Accordingly, thermal cross talk is decreased without deterioration of the characteristics of each laser diode.

SUMMARY OF THE INVENTION

However, in the technique of Japanese Unexamined Patent Application Publication No. 11-274633, it is difficult to increase the width and the depth of the groove so much, and thus laser diodes adjacent to each other are not able to be totally separated electrically. Therefore, there is an issue that electric cross talk occurs.

In view of the foregoing, in the invention, it is desirable to provide a laser diode array capable of inhibiting electric cross talk, a method of manufacturing the same, a printer including the laser diode array, and an optical communication device including the laser diode array.

According to an embodiment of the invention, there is provided a method of manufacturing a laser diode array including the following respective steps A1 to A3:

Step A1: a processing step of forming a peel layer containing an oxidizable material and a vertical resonator structure over a first substrate sequentially from the first substrate side by crystal growth, and then selectively etching the peel layer and the vertical resonator structure to the first substrate, thereby processing into a columnar shape;

Step A2: a peeling step of oxidizing the peel layer from a side face, and then peeling the vertical resonator structure of columnar shape from the first substrate; and Step A3: a rearrangement step of jointing a plurality of vertical resonator structures of columnar shape obtained by the peeling step to a surface of a metal layer of a second substrate formed with the metal layer on a surface.

In the method of manufacturing a laser diode array according to the embodiment of the invention, the peel layer provided between the first substrate and the vertical resonator structure is oxidized from the side face. Thereby, a stress due to oxidation is generated in the peel layer. Thus, by applying an external force to the peel layer, the vertical resonator structure is easily peeled from the first substrate. After that, the plurality of columnar vertical resonator structures obtained by the peeling step is jointed to the surface of the metal layer of the second substrate. Thereby, a resistance component of the first substrate that is connected in series to each vertical resonator structure is separated from each vertical resonator structure.

According to an embodiment of the invention, there is provided a laser diode array including a first substrate in which a metal layer is formed on a surface thereof and a plurality of vertical resonator structures of columnar shape. The respective vertical resonator structures are jointed to a surface of the metal layer. According to embodiments of the invention, there are provided a printer and an optical communication device using the foregoing laser diode array as a light source.

In the laser diode array, the printer, and the optical communication device according to the embodiments of the invention, the respective vertical resonator structures are jointed to the surface of the metal layer. Therefore, a resistance component of the common substrate that is connected in series to each vertical resonator structure (common substrate used for forming each vertical resonator structure) is separated from each vertical resonator structure.

According to the method of manufacturing a laser diode array of the embodiment of the invention, the plurality of columnar vertical resonator structures peeled from the first substrate with the use of oxidation of the peel layer is jointed to the surface of the metal layer of the second substrate. Thus, the resistance component of the first substrate that is connected in series to each vertical resonator structure is separated from each vertical resonator structure. Thereby, electric cross talk generated when the plurality of vertical resonator structures are formed on the common substrate is inhibited from being generated.

According to the laser diode array, the printer, and the optical communication device of the embodiments of the invention, the respective vertical resonator structures are jointed to the surface of the metal layer. Therefore, the resistance component of the common substrate that is connected in series to each vertical resonator structure is separated from each vertical resonator structure. Thereby, electric cross talk generated when the plurality of vertical resonator structures are formed on the common substrate is inhibited from being generated.

BRIEF DESCRIPTION OF THE DRAWINGS

FIG. 7 is an equivalent circuit diagram of the laser diode array of FIG. 1;

FIGS. 8A and 8B are waveform charts of a CW waveform and a pulse waveform inputted to the laser diode array of FIG. 1;

FIG. 18 is an equivalent circuit diagram of the laser diode array of FIG. 11; and FIGS. 19A and 19B are waveform charts for explaining cross talk in the laser diode array of FIG. 11.

DETAILED DESCRIPTION OF THE PREFERRED EMBODIMENT

Descriptions will be given of an embodiment of the invention in detail with reference to the drawings.

Figure 1:
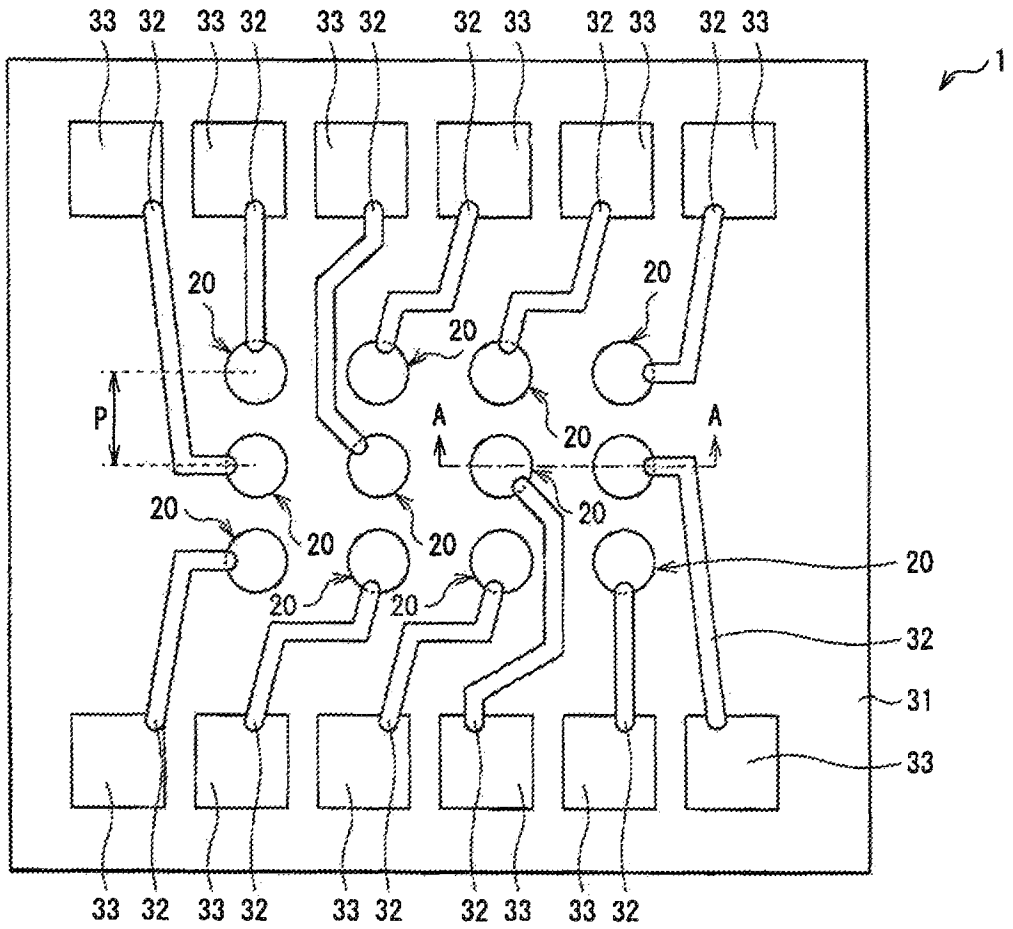
FIG. 1 is a top view of a laser diode array according to an embodiment of the invention.
Figure 2:
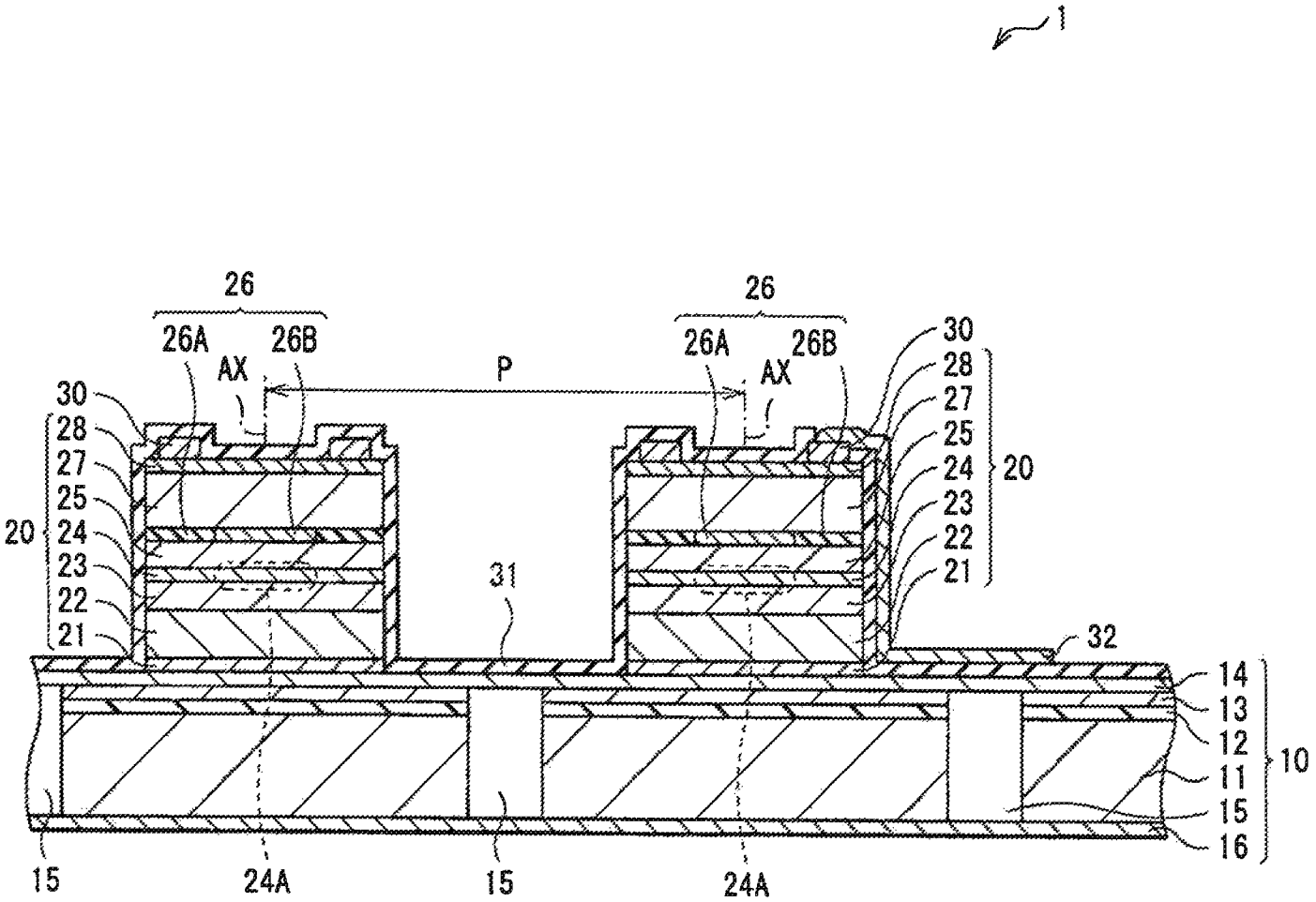
FIG. 2 is a cross section view taken along arrows A-A of the laser diode array of FIG. 1.

FIG. 1 shows a top view of a laser diode array 1 according to an embodiment of the invention. FIG. 2 shows a cross sectional configuration taken along arrows A-A of the laser diode array 1 of FIG. 1. FIG. 1 and FIG. 2 schematically show the laser diode array 1, and the dimensions and the shapes in the figures are different from those actually used.

The laser diode array 1 includes a plurality of Vertical Cavity Surface Emitting Laser (VCSEL) devices 20 (vertical resonator structure) on a support substrate 10. The laser diode array 1 has a function to concurrently output a plurality of laser lights having the same wavelength.

Further, in the laser diode array 1, the plurality of laser diode devices 20 is arranged on the surface on a metal layer 14 (described later) side of the support substrate 10, so that the distance P between each optical axis AX of each laser light emitted from each laser diode device 20 is as short as possible. For example, as shown in FIG. 1, the respective laser diode devices 20 are arranged in a lattice pattern at almost even intervals. However, the laser diode devices 20 are not necessarily arranged in a vertical and reticular pattern at almost even intervals, but they may be, for example, arranged in a line at almost even intervals.

Support Substrate 10

The support substrate 10 has, for example, a support base 11, an insulating layer 12, an adhesive layer 13, the metal layer 14, a via 15 (connection part), and an electrode layer 16. The insulating layer 12, the adhesive layer 13, and the metal layer 14 are layered in this order from the support base 11 side on one face side of the support base 11. The electrode layer 16 is formed on the other face side of the one face of the support base 11. The via 15 is formed to penetrate through the support base 11, the insulating layer 12, and the adhesive layer 13. One end thereof is in contact with the lower face of the metal layer 14, and the other end thereof is in contact with the top face of the electrode layer 16.

The support base 11 is made of a material different from that of the laser diode device 20. The support base 11 is made of, for example, a silicon substrate. The insulating layer 12 is made of an insulative material such as silicon oxide ($SiO_2$) and silicon nitride (SiN). The adhesive layer 13 is made of, for example, multicrystalline silicon, amorphous silicon or the like. The multicrystalline silicon and the amorphous silicon have a high affinity with the insulative material, such as silicon oxide ($SiO_2$) and silicon nitride (SiN). Thus, when the insulative material such as silicon oxide ($SiO_2$) and silicon nitride (SiN) is used as the insulating layer 12 and the multicrystalline silicon or the amorphous silicon is used as the adhesive layer 13, the contact characteristics between the insulating layer 12 and the adhesive layer 13 become strong.

Laser Diode Device 20

The laser diode device 20 is joined to the metal layer 14 of the support substrate 10. The laser diode device 20 has a columnar vertical resonator structure in which, for example, a lower contact layer 21, a lower DBR layer 22, a lower spacer layer 23, an active layer 24, an upper spacer layer 25, a current confinement layer 26, an upper DBR layer 27, and an upper contact layer 28 are layered in this order from the metal layer 14 side. That is, the laser diode device 20 is obtained by removing a separately prepared semiconductor substrate 40 (described later) from a structure in which the foregoing vertical resonator structure is formed by crystal growth on the semiconductor substrate 40.

The lower contact layer 21 is made of, for example, n-type $Al_{x1}Ga_{1-x1}As$ ($0 \leq x1 < 1$). The lower DBR layer 22 is formed by alternately layering a low refractive index layer (not shown) and a high refractive index layer (not shown). The low refractive index layer is made of, for example, n-type $Al_{x2}Ga_{1-x2}As$ ($0 < x2 < 1$) having an optical thickness of $\square_1/4$ ($\square_1$ is an oscillation wavelength). The high refractive index layer is made of, for example, n-type $Al_{x3}Ga_{1-x3}As$ ($0 \leq x3 < x2$) having an optical thickness of $\square_1/4$. The lower spacer layer 23 is made of, for example, n-type $Al_{x4}Ga_{1-x4}As$ ($0 \leq x4 < 2$). The lower contact layer 21, the lower DBR layer 22, and the lower spacer layer 23 contain a n-type impurity, such as silicon (Si).

The active layer 24 has a multi-quantum well structure in which a well layer (not shown) made of undoped $In_{x5}Ga_{1-x5}As$ ($0 < x5 < 1$) and a barrier layer (not shown) made of undoped $In_{x6}Ga_{1-x6}N$ ($0 < x6 < x5$) are alternately layered. Of the active layer 24, the region opposed to a current injection region 26A (described later) is a light emitting region 24A.

The upper spacer layer 25 is made of, for example, p-type $Al_{x7}Ga_{1-x7}As$ ($0 \leq x7 < 1$). The upper DBR layer 27 is formed by alternately layering a low refractive index layer (not shown) and a high refractive index layer (not shown). The low refractive index layer is made of, for example, p-type $Al_{x8}Ga_{1-x8}As$ ($0 < x8 < 1$) having an optical thickness of $\square_1/4$. The high refractive index layer is made of, for example, p-type $Al_9Ga_{1-x9}N$ ($0 \leq x9 < x8$) having an optical thickness of $\square_1/4$. The upper contact layer 28 is made of, for example, p-type $Al_{x10}Ga_{1-x10}N$ ($0 \leq x10 < 1$). The upper spacer layer 25, the upper DBR layer 27, and the upper contact layer 28 include a p-type impurity, such as magnesium (Mg).

The current confinement layer 26 has a current confinement region 26B in the peripheral region of a current injection region 26A.

The current injection region 26A is made of, for example, p-type $Al_{x11}Ga_{1-x11}As$ ($0 < x11 \leq 1$). The current injection region 26A is preferably made of a material having an oxidation rate equal to or slower than that of a peel layer 41D described later.

For example, when the peel layer 41D is made of AlAs, the current injection region 26A is made of $Al_{x11}Ga_{1-x11}As$ ($0.98 \leq x11 \leq 1$). In the case where the current injection region 26A is made of AlAs (x11=1), the thickness of the current injection region 26A needs to be smaller than the thickness of the peel layer 41D. Meanwhile, when the current injection region 26A is made of $A1_{x11}Ga_{1-x11}As$ ($0.98 \leq x11 < 1$), the thickness of the current injection region 26A may be equal to or smaller than the thickness of the peel layer 41D. However, as will be described later, when the oxidation step of the peel layer 41D is performed separately from the oxidation step of the current confinement layer 26D, the material of the current injection region 26A is not particularly limited in relation to the peel layer 41D.

Meanwhile, the current confinement region 26B contains, for example, $Al_2O_3$ (aluminum oxide). As will be described later, the current confinement region 26B is obtained by oxidizing concentrated Al contained in a current confinement layer 26D from the side face. Therefore, the current confinement layer 26 has a function of confining a current.

In the laser diode device 20 of this embodiment, a circular electrode layer 30 is formed on the top face of the upper contact layer 28. The electrode layer 30 is formed by layering, for example, a Ti layer, a Pt layer, and an Au layer in this order. The electrode layer 30 is electrically connected to the upper contact layer 28.

Further, an insulating film 31 is formed over the entire surface including each laser diode device 20 and the electrode layer 30. The insulating film 31 is made of an insulative material, such as silicon oxide ($SiO_2$) and silicon nitride (SiN). An aperture is formed in part of the region opposed to the electrode layer 30 of the insulating film 31. An electrode pad 33 electrically connected to a wiring layer 32 through the aperture is formed on the surface of the insulating film 31 (refer to FIG. 1).

The laser diode array 1 having the foregoing configuration may be manufactured as follows, for example.

First, the laser diode device 20 is manufactured. For example, in the case where the vertical resonator structure is formed from GaAs-based Group III-V compound semiconductor, for example, the vertical resonator structure is formed by the Metal Organic Chemical Vapor Deposition (MOCVD) method with the use of TMA (trimethyl aluminum), TMG (trimethyl gallium), TMIn (trimethyl indium), or $AsH_3$ (arsine) as a raw material gas.

The GaAs-based Group III-V compound semiconductor represents a semiconductor that contains at least Ga out of the Group 3B elements in the short period periodic table and at least As (arsenic) out of the Group 5B elements in the short period periodic table.

Figure 3A:
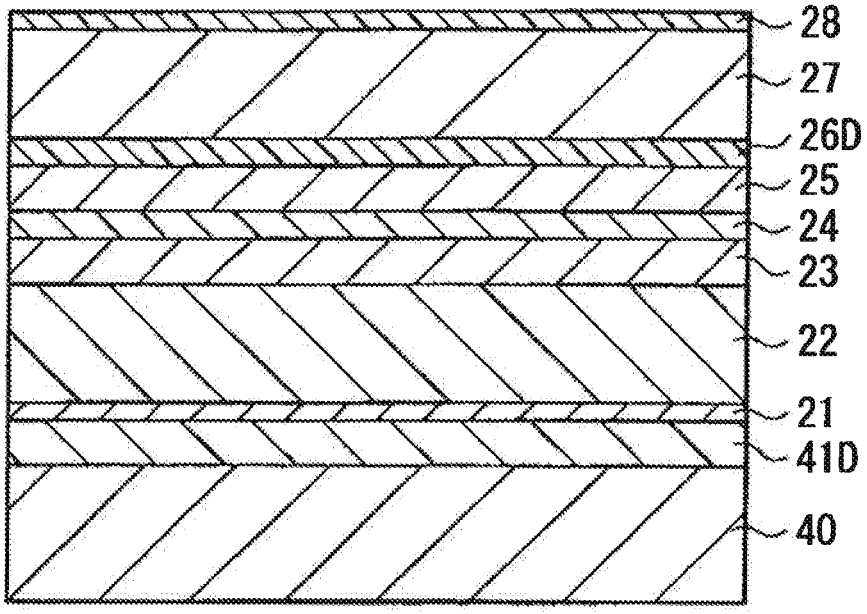
FIGS. 3A and 3B are cross section views for explaining an example of a method of manufacturing the laser diode array of FIG. 1.

Specifically, the peel layer 41D, the lower contact layer 21, the lower DBR layer 22, the lower spacer layer 23, the active layer 24, the upper spacer layer 25, the current confinement layer 26D (layer to be oxidized), the upper DBR layer 27, and the upper contact layer 28 are layered in this order over the semiconductor substrate 40 (GaAs substrate) (FIG. 3A).

The foregoing current confinement layer 26D is made of the same material as that of the current injection region 26A, and will become the current confinement layer 26 by the after-mentioned oxidation treatment. The peel layer 41D is preferably structured to have a faster oxidation rate in the lamination in-plane direction than that of the current confinement layer 26D.

For example, in the case where the current confinement layer 26D is made of the same material as that of the peel layer 41D (for example, $Al_{x11}Ga_{1-x11}As$ ($0.98 < x11 \leq 1$), the thickness of the peel layer 41D is preferably larger than that of the current confinement layer 26D. In the case where the current confinement layer 26D is made of $Al_{x11}Ga_{1-x11}As$ ($0.98 < x11 < 1$), the peel layer 41D is preferably made of AlAs. In the case where the current confinement layer 26D is made of $Al_{x11}Ga_{1-x11}As$ ($0.98 < x11 < 1$) and the peel layer 41D is made of AlAs, that is, when the peel layer 41D is made of a material having a faster oxidation rate than that of the current confinement layer 26D, the thickness of the peel layer 41D may be equal to or larger than the thickness of the current confinement layer 26D.

Figure 3B:
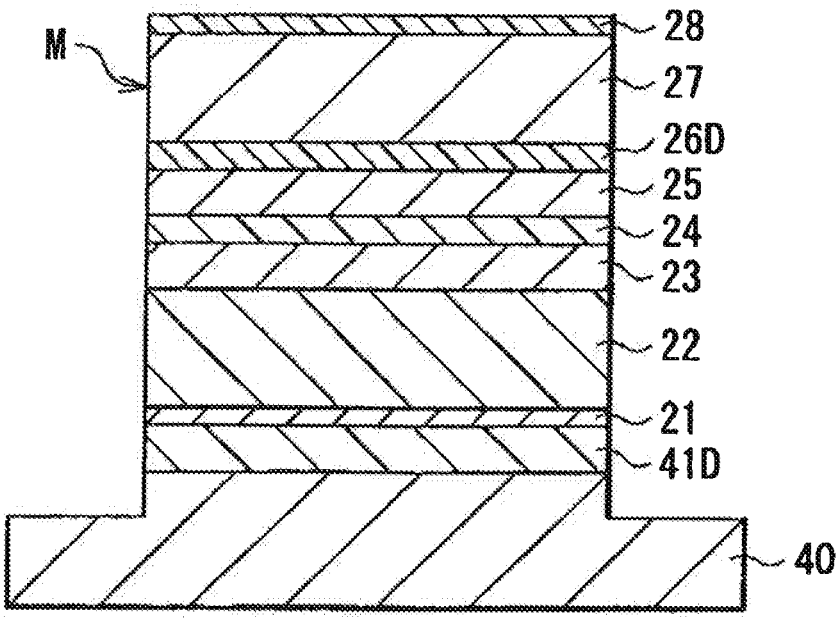

Next, a region from the upper contact layer 28 to part of the semiconductor substrate 40 is selectively etched by, for example, the dry etching method to form a mesa shape (FIG. 3B). Thereby, the peel layer 41D is exposed on the side face of a mesa M.

Figure 4A:
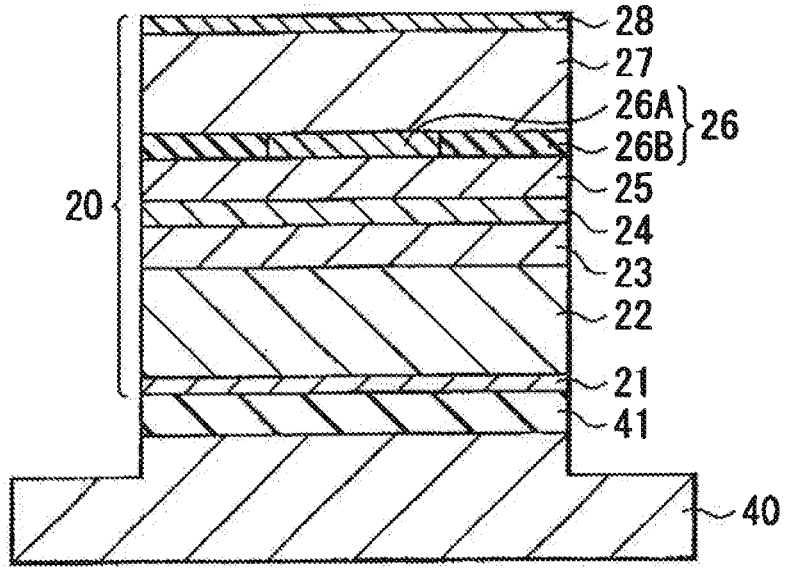
FIGS. 4A and 4B are cross section views for explaining steps following FIGS. 3A and 3B.

Next, heat treatment is performed at high temperature in a water vapor atmosphere, and the current confinement layer 26D and the peel layer 41D are concurrently oxidized from the side face of the mesa M. The oxidation treatment is performed until almost all of the peel layer 41D is oxidized and the diameter of the non-oxidized region of the current confinement layer 26D becomes a desired value. Thereby, almost all of the peel layer 41D becomes an insulating layer (aluminum oxide), and an oxidized peel layer 41 is formed (FIG. 4A). Further, since the outer edge region of the current confinement layer 26D becomes an insulating layer (aluminum oxide), the current confinement region 26B is formed in the outer edge region, and the current injection region 26A is formed in the central region thereof. Accordingly, the laser diode device 20 is formed over the semiconductor substrate 40 (FIG. 4A).

Figure 4B:
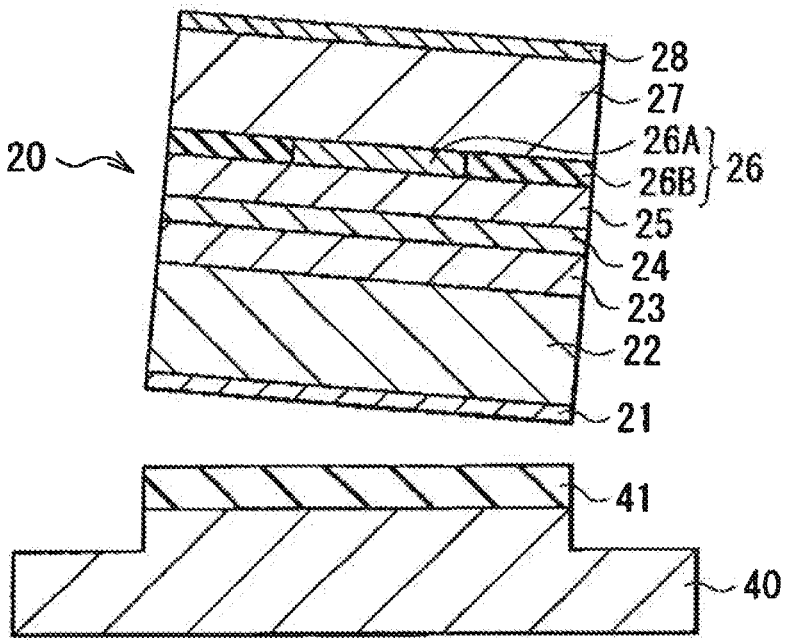

Next, for example, the laser diode device 20 is peeled from the semiconductor substrate 40 by, for example, vacuum contact or by using a light curable adhesive sheet or the like (FIG. 4B). Out of the interfaces between each layer composing the laser diode device 20, at the interface between the oxidized peel layer 41 and the lower contact layer 21, the oxidized peel layer 41 and the lower contact layer 21 are not contacted with each other in a graded manner. That is, at the interface between the oxidized peel layer 41 and the lower contact layer 21, an interlayer in which the both materials are mixed with each other does not exist. Otherwise, even if such an interlayer exists, the interlayer slightly exists to the degree that the interlayer is ignorable compared to the thickness of interlayer at the other interfaces. Thus, since a stress caused by oxidation has been applied to the interface between the oxidized peel layer 41 and the lower contact layer 21, the laser diode device 20 is able to be relatively easily peeled at the interface between the oxidized peel layer 41 and the lower contact layer 21 or in the vicinity thereof by the peeling step.

Heating (alloying) may be performed at about from 300 deg C. to 400 deg C. before the peeling step. In this case, the stress at the interface between the oxidized peel layer 41 and the lower contact layer 21 is further increased, and thus the laser diode device 20 is able to be easily peeled. If the oxidized peel layer 41 remains on the laser diode device 20 side, the portion of the oxidized peel layer 41 remaining on the laser diode device 20 side is removed by wet etching.

Figure 5:
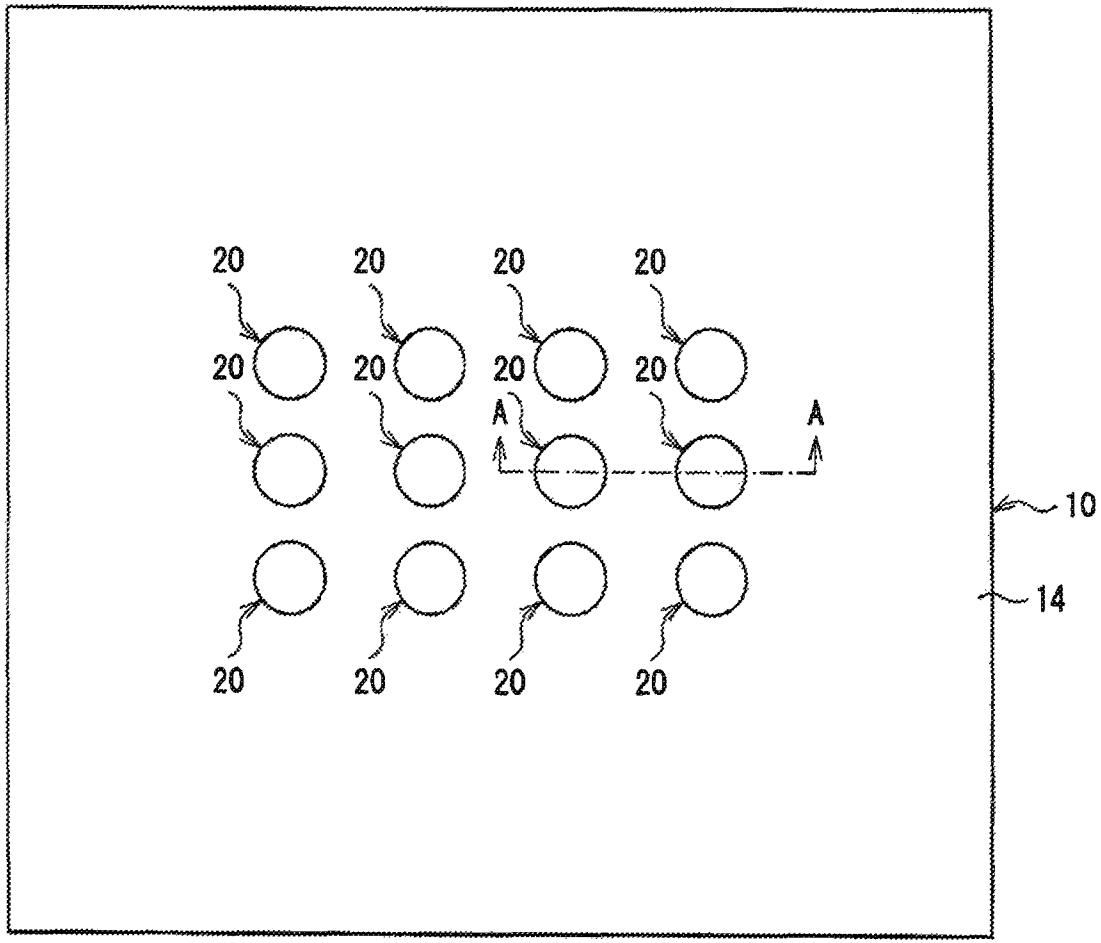
FIG. 5 is a top view for explaining a step following FIGS. 4A and 4B.
Figure 6:
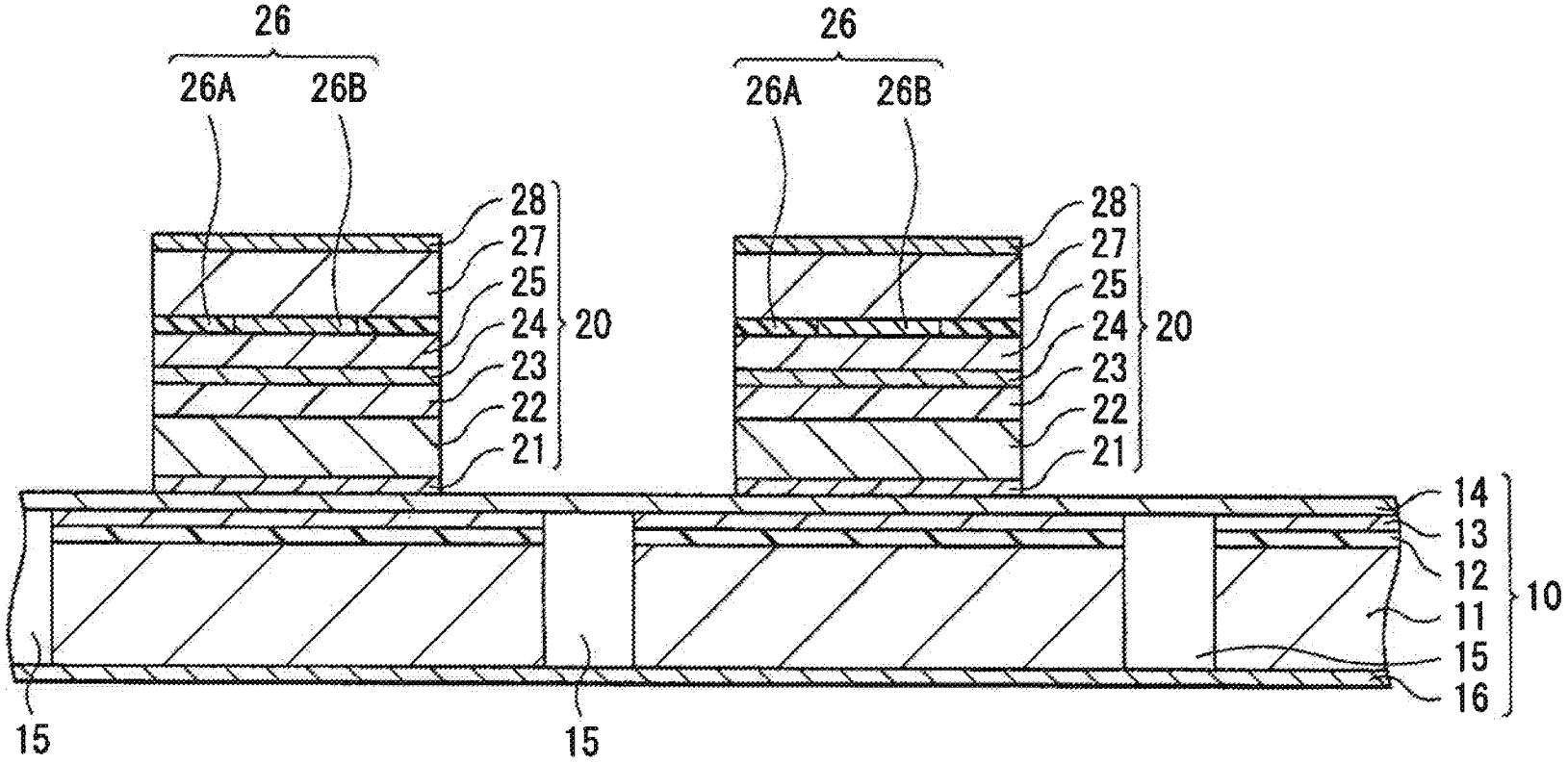
FIG. 6 is a cross section view taken along arrows A-A of FIG. 5.

Next, the plurality of laser diode devices 20 is arranged with the lower contact layer 21 side downward on the metal layer 14 of the support substrate 10 and jointed to the metal layer 14 (FIG. 5 and FIG. 6). FIG. 6 is a cross sectional configuration view taken along arrows A-A of FIG. 5.

Next, the circular electrode layer 30 is formed on the top face of the laser diode device 20 (FIG. 2). Subsequently, the insulating film 31 is formed over the entire surface including the laser diode device 20 and the electrode layer 30. After that, the electrode pad 33 is formed in a place with a given distance from the laser diode 20 in the surface of the insulating film 31. After that, the aperture (not shown) is formed in part of the region opposed to the electrode layer 30 in the insulating film 31. After that, the wiring layer 32 extending from the surface of the electrode layer 30 exposed in the aperture to the electrode pad 33 is formed. Accordingly, the laser diode array 1 of this embodiment is manufactured.

In the laser diode array 1 of this embodiment, when a given voltage is applied between the connection pad 33 electrically connected to the electrode layer 30 on each laser diode device 20 and the electrode layer 16, a current is injected into the active layer 24, light emission is generated by electron-hole recombination, and stimulated emission is repeated in the device. As a result, laser oscillation is generated in a given wavelength $\square_1$, and laser light in wavelength $\square_1$ is outputted outside from the light emitting region 24A of each laser diode device 20 through the aperture of the electrode layer 30.

Figure 17:
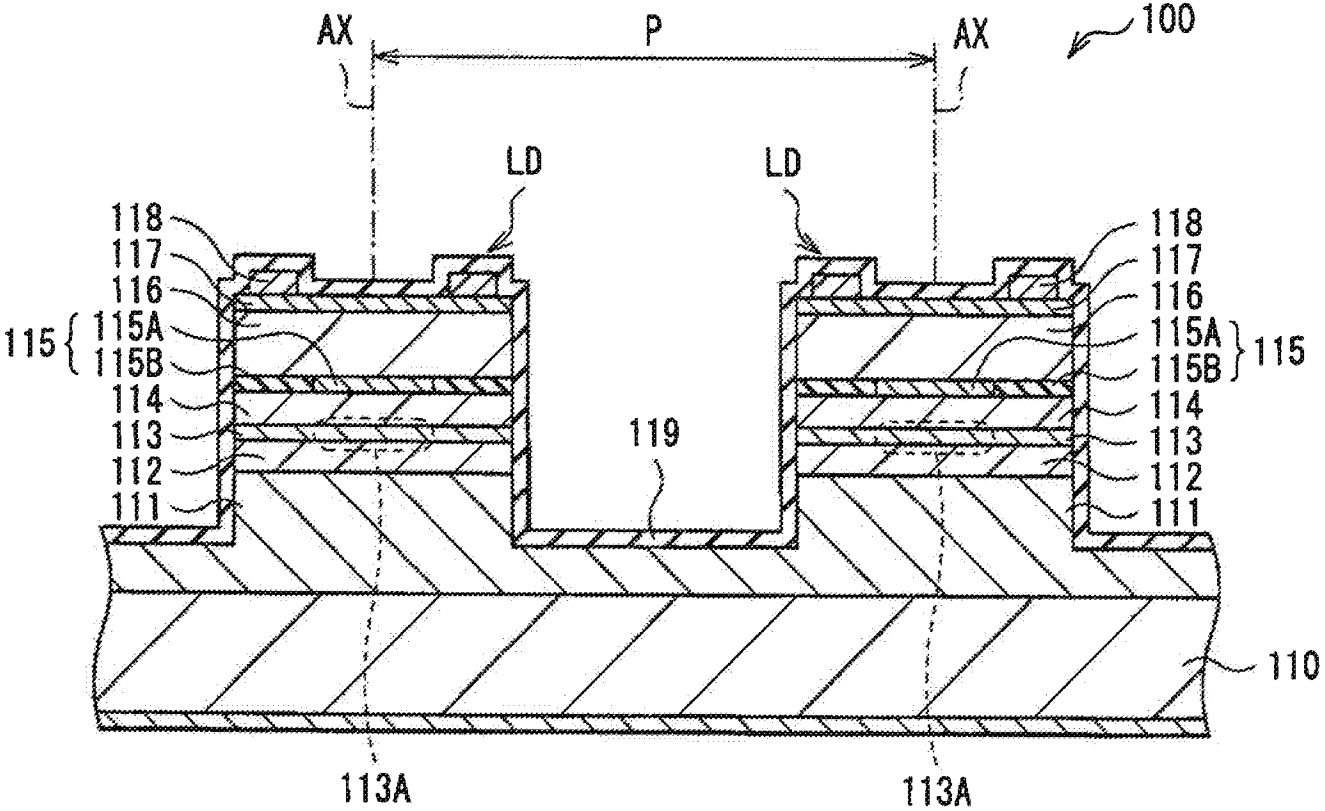
FIG. 17 RELATED ART
FIG. 17 is a cross section view of a laser diode array of a related art.

In a laser diode array 100 of the related art shown in FIG. 17, that is, in the laser array in which a columnar VCSEL 120 obtained by layering, for example, a lower DBR layer 121, a lower spacer layer 122, an active layer 123, an upper spacer layer 124, a current confinement layer 125 (current injection region 125A and a current confinement region 125B), an upper DBR layer 126, and an upper contact layer 127 in this order over a common substrate 110 is directly formed by crystal growth, as shown in the equivalent circuit shown in FIG. 18, a resistance component R3 exists between each laser diode 120 and a ground GND independently of a current path of other laser diode 120, and a resistance component R4 exists on the current path common to each laser diode 120.

The resistance component R4 is a resistance component of the common substrate 110. In the case where the resistance component R4 exists, for example, when one laser diode device 120 is CW-driven as shown in FIG. 8A and another laser diode device 120 adjacent to the foregoing one laser diode device 120 is pulse-driven as shown in FIG. 8B, in the equivalent circuit of FIG. 18, an input voltage $V_{L1}$ of the CW-driven laser diode device 120 has a wavy waveform including noise as shown in FIG. 19A, and an input voltage $V_{L2}$ of the pulse-driven laser diode device 120 has a distorted rectangular waveform including noise as shown in FIG. 19B. That is, electric cross talk is generated between the laser diode devices 120 adjacent to each other.

Meanwhile, in this embodiment, each laser diode device 20 is jointed to the surface of the metal layer 14 of the support substrate 10. Thus, as shown in FIG. 7, in the equivalent circuit of the laser diode array 1, the resistance component R3 exists between each laser diode device 20 and the ground GND independently of a current path of the other laser diode device 20, but no resistance component exists on the current path common to each laser diode device 20. This is because, in the manufacturing course of this embodiment, the semiconductor substrate 40 is removed (peeled) from the structure in which the vertical resonator structure is formed by crystal growth over the semiconductor substrate 40, and thereby the resistance component of the semiconductor substrate 40 that is connected in series to each vertical resonator structure is separated from each vertical resonator structure.

Thereby, for example, in the case where one laser diode device 20 is CW-driven as shown in FIG. 8A and another laser diode device 20 adjacent to the foregoing one laser diode device 20 is pulse-driven as shown in FIG. 8B, in the equivalent circuit of FIG. 7, the input voltage $V_{L1}$ of the CW-driven laser diode device 20 has a flat waveform not including noise as an input voltage waveform, and the input voltage $V_{L2}$ of the pulse-driven laser diode device 20 has a rectangular waveform not including noise as the input voltage waveform. That is, electric cross talk is not generated between the laser diode devices 20 adjacent to each other.

As described above, in this embodiment, since each laser diode device 20 is jointed to the surface of the metal layer 14 of the support substrate 10, the resistance component of the semiconductor substrate 40 that is connected in series to each laser diode device 20 is separated from each laser diode device 20. Thereby, electric cross talk between the laser diode devices 20 adjacent to each other is inhibited from being generated.

Modification

In the foregoing embodiment, the oxidation steps of the peel layer 41D and the current confinement layer 26D are concurrently performed. However, each oxidation step may be performed separately. For example, it is possible that after the side face of the current confinement layer 26D is coated with a protective film so that the side face of the peel layer 41D is not coated therewith, the oxidized peel layer 41 is formed by oxidizing the peel layer 41D from the side face, the protective film is removed, and then the current confinement layer 26D is oxidized from the side face to form the current confinement layer 26.

Further, the formation step of the laser diode device 20 may be performed, for example, as follows. First, the peel layer 41D, the lower contact layer 21, the lower DBR layer 22, the lower spacer layer 23, the active layer 24, the upper spacer layer 25, the current confinement layer 26D (layer to be oxidized), the upper DBR layer 27, and the upper contact layer 28 are layered in this order over the semiconductor substrate 40 (GaAs substrate) (FIG. 3A). Then, a region from the upper contact layer 28 to part of the lower DBR layer 22 is selectively etched by, for example, a dry etching method to form a mesa shape.

Figure 9A:
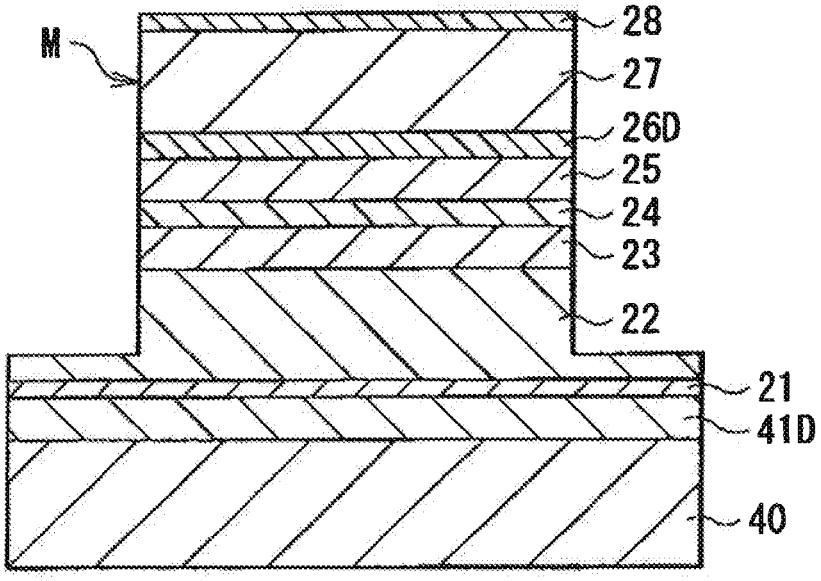
FIGS. 9A and 9B are cross section views for explaining another example of a method of manufacturing the laser diode array of FIG. 1.
Figure 9B:
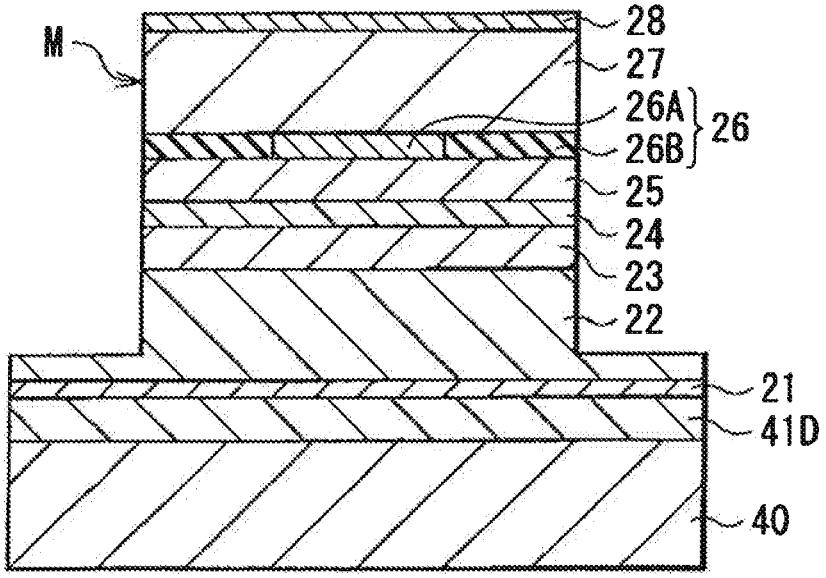

Next, heat treatment is performed at a high temperature in the water vapor atmosphere, the current confinement layer 26D is oxidized from the side face of the mesa M to form the current confinement layer 26 (FIG. 9B). Since the peel layer 41D is not exposed on the side face of the mesa M, the peel layer 41D is not oxidized.

Figure 10A:
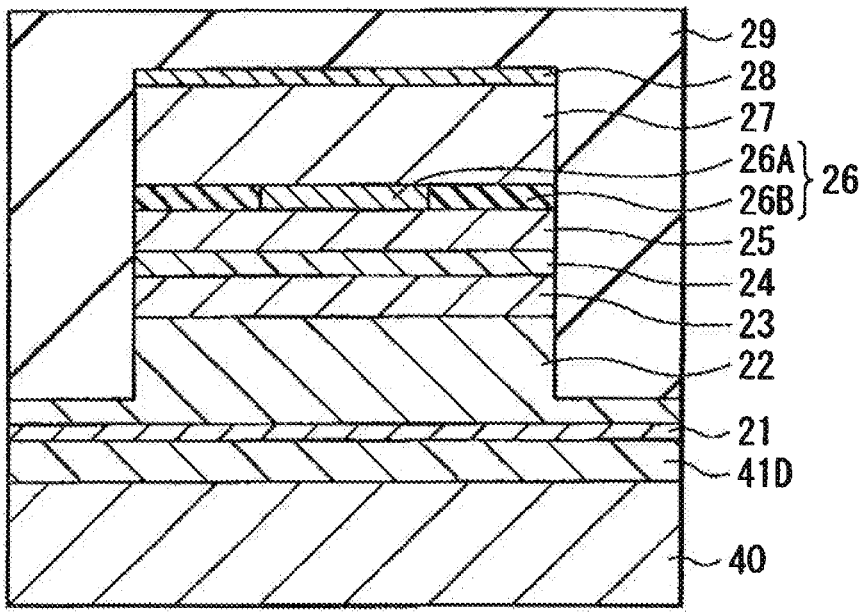
FIGS. 10A and 10B are cross section views for explaining steps following FIGS. 9A and 9B.
Figure 10B:
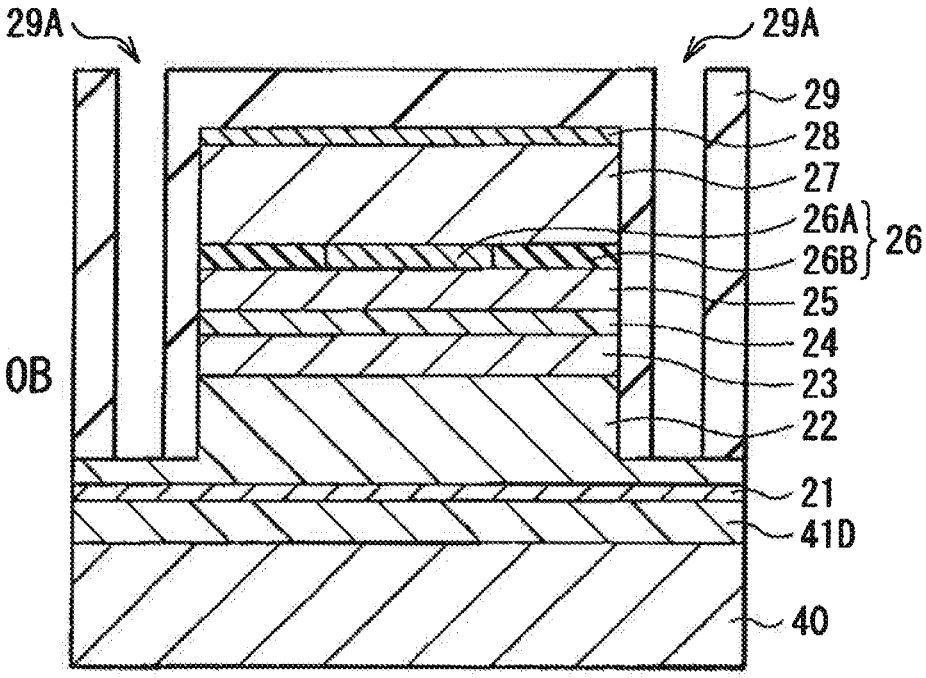

Next, a protective film 19 is formed on the entire surface including the mesa M (FIG. 10A). After that, a groove 29A penetrating thorough the protective film 19 is formed to surround the mesa M (FIG. 10B). Thereby, the lower DBR layer 22 is exposed on the bottom face of the groove 29A.

Figure 11A:
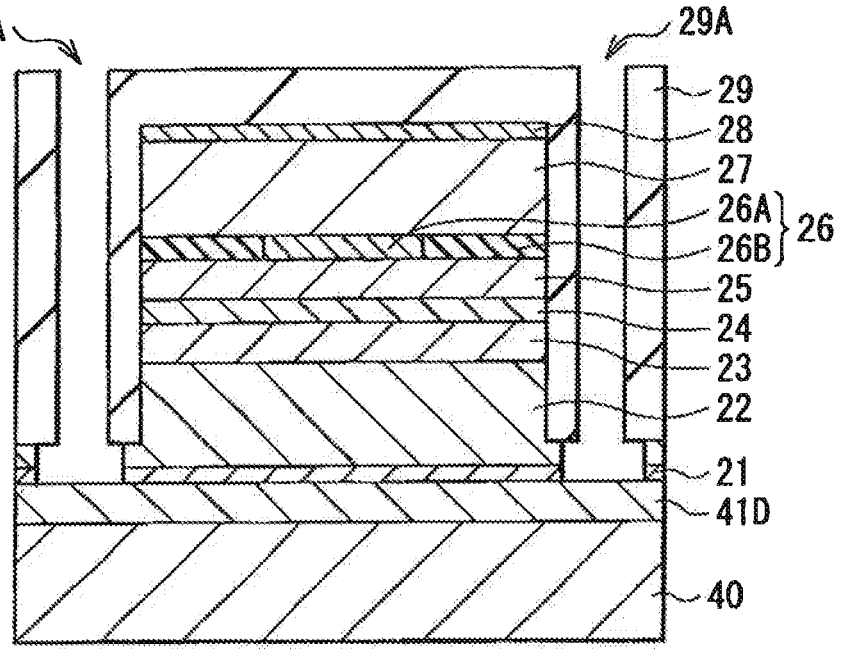
FIGS. 11A and 11B are cross section views for explaining steps following FIGS. 10A and 10B.
Figure 11B:
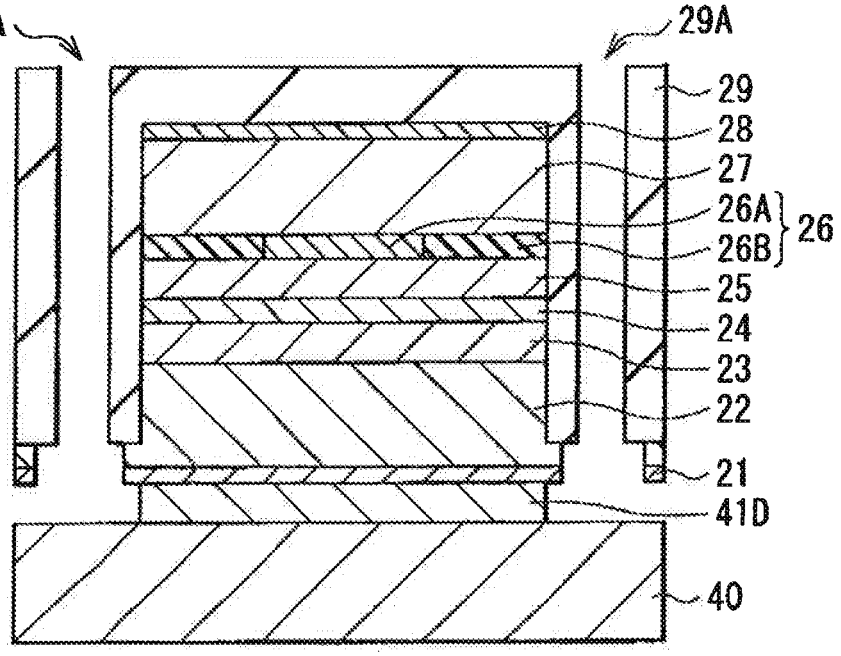

Next, for example, the lower DBR layer 22 and the lower contact layer 21 that are directly under the groove 29A are selectively removed by using, for example, a phosphoric acid etchant (FIG. 11A). After that, the peel layer 41D is selectively removed by using a fluorinated acid etchant (FIG. 11B). Thereby, the contact force by the peel layer 41D between the semiconductor substrate 40 and the lower DBR layer 22 is lowered.

Figure 12A:
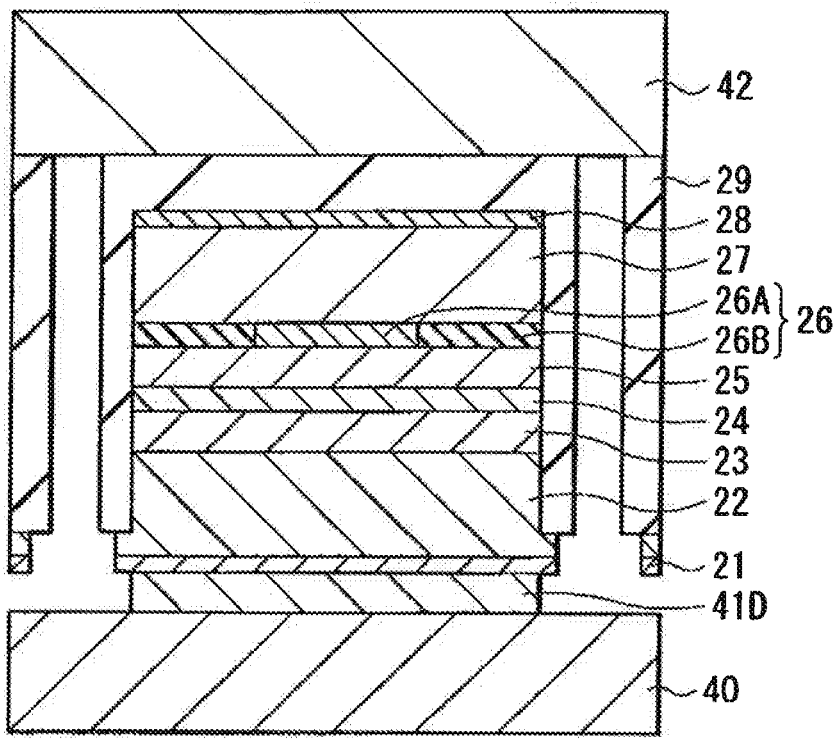
FIGS. 12A and 12B are cross section views for explaining steps following FIGS. 11A and 11B.
Figure 12B:
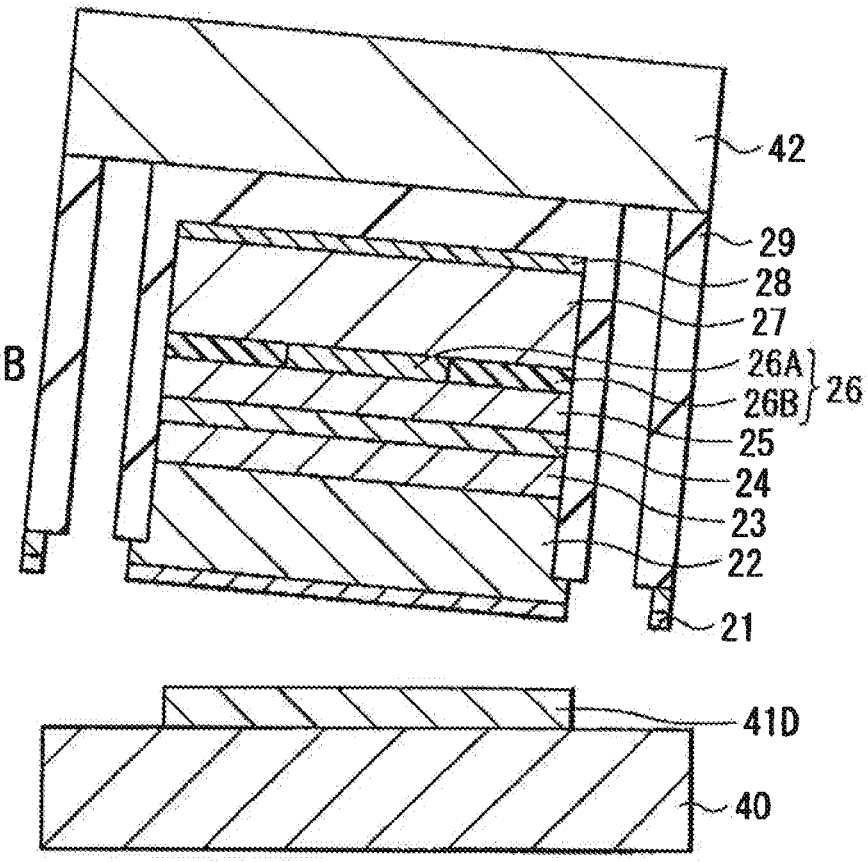

Next, a support substrate 42 is bonded to the top face of the protective film 19 (FIG. 12A). After that, by using the support substrate 42, the laser diode device 20 is peeled from the semiconductor substrate 40 (FIG. 12B). Accordingly, the laser diode device 20 is able to be formed as well.

Figure 13:
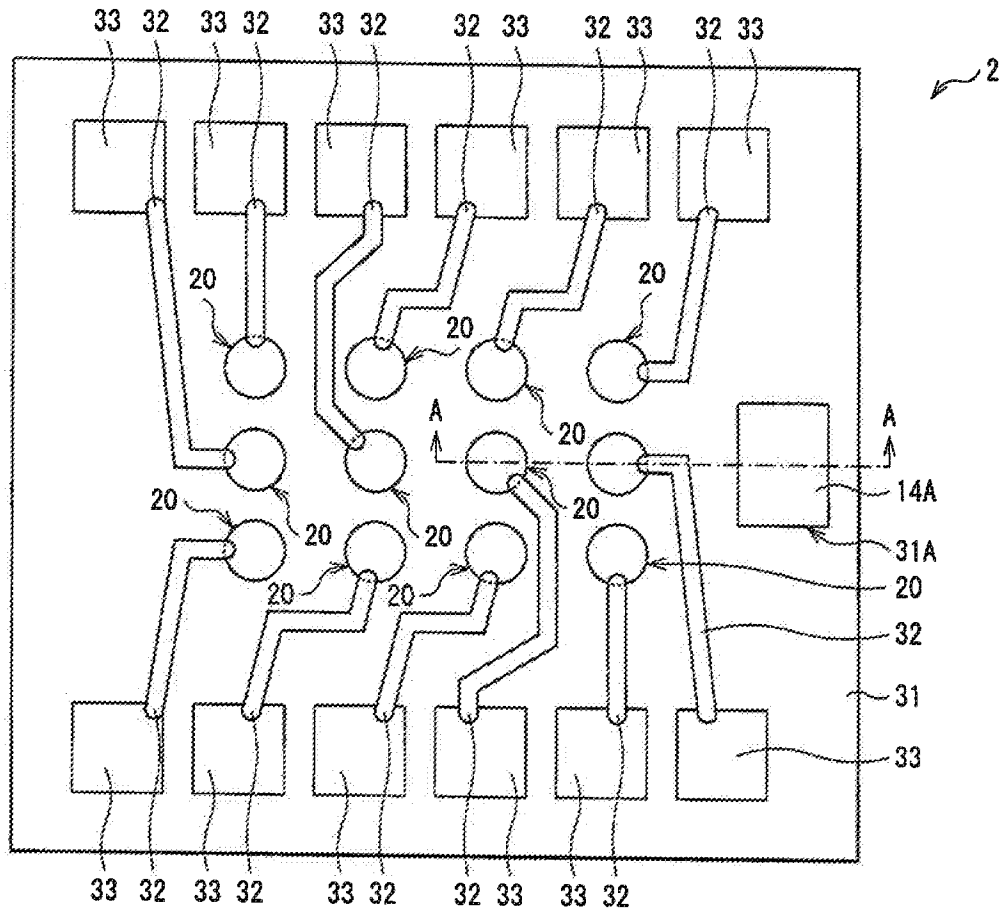
FIG. 13 is a top view of a modification of the laser diode array of FIG. 1.
Figure 14:
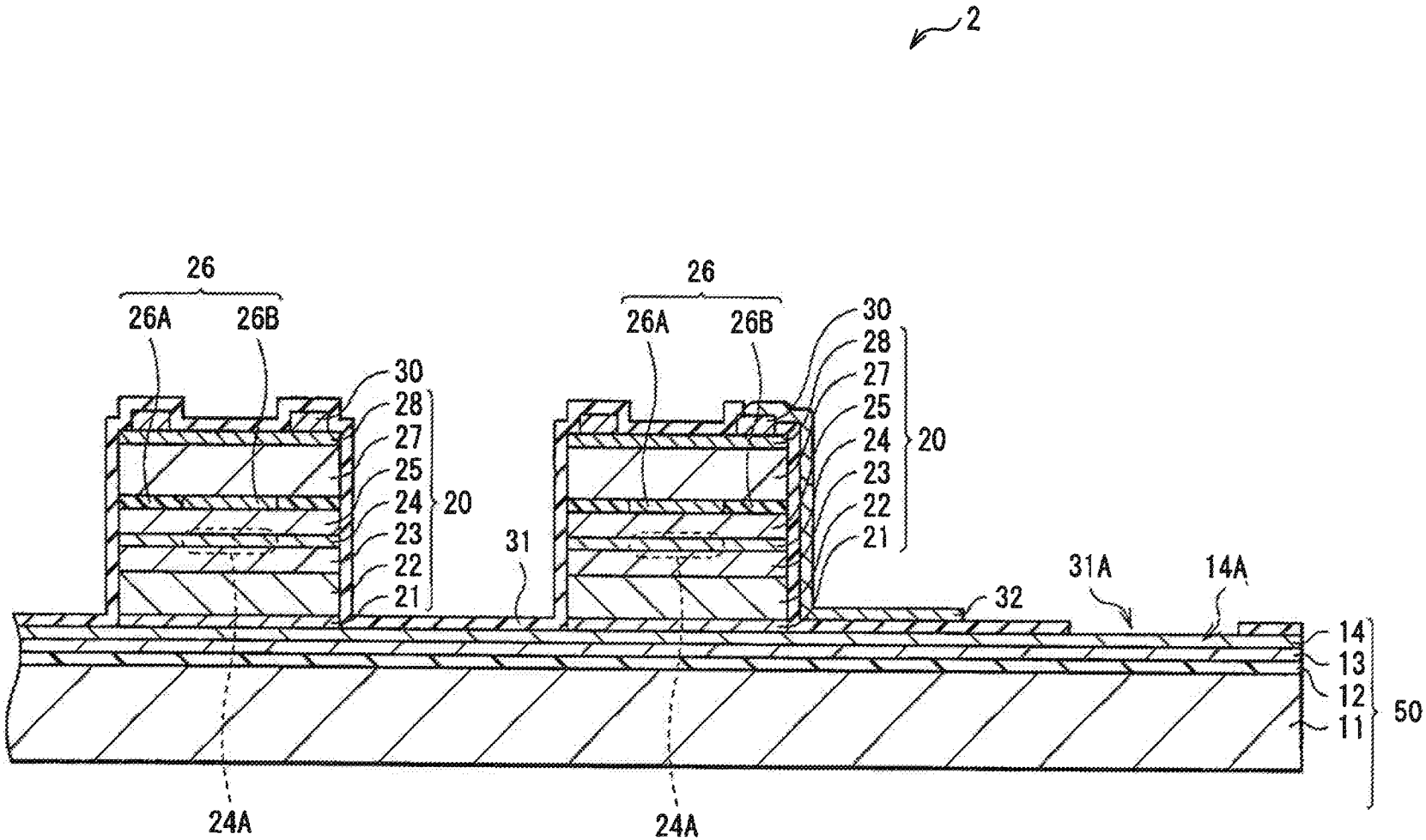
FIG. 14 is a cross section view taken along arrows A-A of the laser diode array of FIG. 13.

In the foregoing embodiment, the VCSEL 20 is jointed to the surface of the metal layer 14 of the support substrate 10 having the via 15. However, for example, as shown in FIG. 13 and FIG. 14, it is possible that a support substrate 50 in which the insulating layer 12, the adhesive layer 13, and the metal layer 14 are sequentially layered from the support base 11 side is prepared on one surface of the support base 11, and the VCSEL 20 is jointed to the surface of the metal layer 14 of the support substrate 50. However, in this case, for example, it is necessary that an aperture 31A is formed in part of the insulating layer 31 formed on the surface of the metal layer 14, part of the metal layer 14 is exposed from the aperture, and the exposed section is used as an electrode pad 14A to decrease the potential of the metal layer 14 to the ground potential.

Further, in the foregoing embodiment, the wiring layer 32 and the electrode pad 33 are formed over the support substrate 10 with the insulating layer 31 in between. However, for example, it is possible to provide a buried layer made of an insulative material, such as polyimide, around the laser diode device 20, the wiring layer 32 and the electrode pad 33 that are formed on the top face of the buried layer, and thereby the capacity component generated between the wiring layer 32 electrode pad 33 and the metal layer 14 is decreased as much as possible.

Application Example

Figure 15:
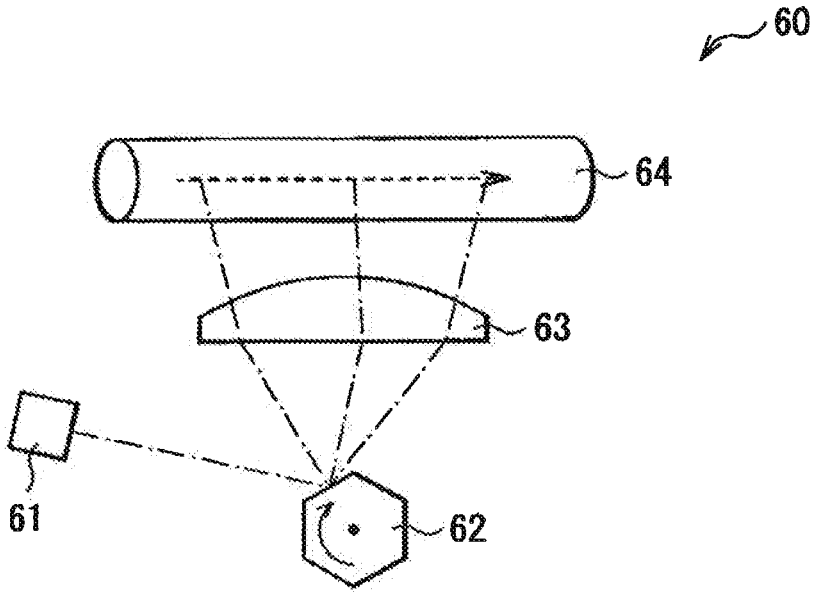
FIG. 15 is a schematic structural view of a printer according to an application example.
Figure 16:
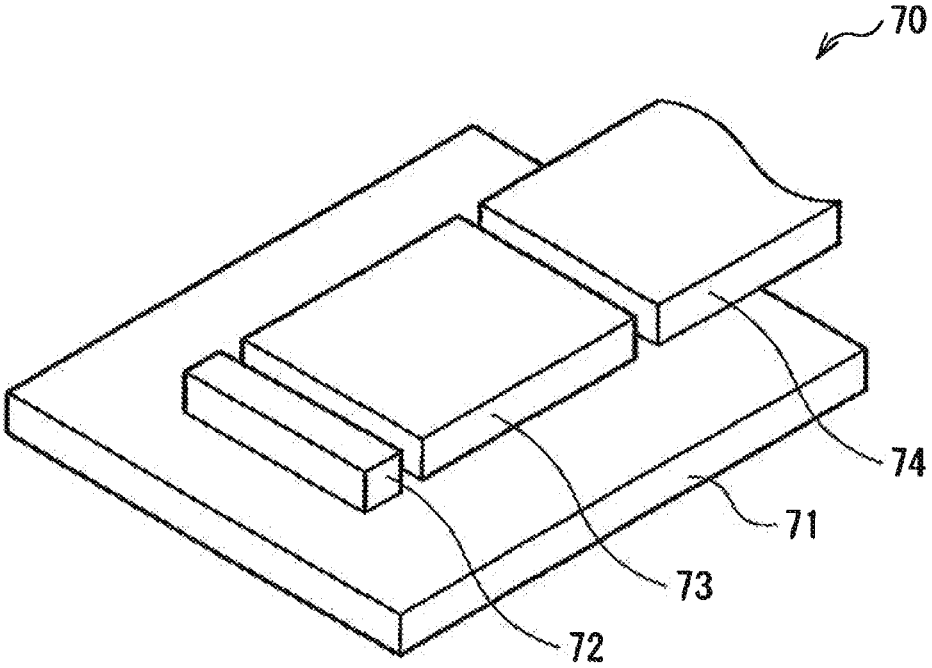
FIG. 16 is a schematic structural view of an optical communication device according to another application example.

The laser diode array 1 according to the foregoing embodiment or the modification thereof is suitably applicable to, for example, a printer, such as a laser printer, and an optical communication device, such as a multichannel optical integrated device. For example, as shown in FIG. 15, as a light source 61 in a laser printer 60 including the light source 61, a polygon mirror 62 for reflecting light from the light source 61 and scanning the reflected light, a f□ lens 63 for guiding the light from the polygon mirror 62 to a photoconductive drum 64, the photoconductive drum 64 receiving the light from the f□ lens 63 to form an electrostatic latent image, and a toner supplier (not shown) adhering the toner according to the electrostatic latent image to the photoconductive drum 64, the laser diode array 1 may be used. Further, for example, as shown in FIG. 16, as a light source 72 in an optical communication device 70 including the light source 72, a light guide 73 in which a light input end is arranged correspondingly to a light output end of the light source 72, and an optical fiber 74 in which a light input end is provided correspondingly to a light output end of the light guide 73 on a support substrate 71, the laser diode array 1 may be used.

While the descriptions hereinbefore have been given of the invention with reference to the embodiment and the like, the invention is not limited to the foregoing embodiment and the like, and various modifications may be made.

It should be understood by those skilled in the art that various modifications, combinations, subcombinations and alternations may occur depending on design requirements and other factors insofar as they are within the scope of the appended claims or the equivalents thereof.

What is claimed is:

[1. A laser diode array comprising:

a support substrate including a support base, a first insulating layer, an adhesive layer, and a metal layer;

a plurality of vertical resonator structures of columnar shape jointed to a surface of the metal layer, where each vertical resonator structure includes a first contact layer jointed to the metal layer, a first DBR layer, a first spacer layer, an active layer, a second spacer layer, a second DBR layer, and a second contact layer sequentially from the metal layer side; and an aperture formed in a second insulating layer configured to expose a portion of the metal layer.]

[2. The laser diode array according to claim 1, wherein the respective vertical resonator structures are obtained by removing a second substrate from a structure formed by crystal growth on the second substrate.]

[3. The laser diode array according to claim 1, wherein the vertical resonator structure is made of a material different from a material of the support substrate.]

[4. The laser diode array according to claim 1, wherein in the support substrate, one or a plurality of connection parts that penetrate a portion other than the metal layer in the support substrate are formed to be in contact with the metal layer.]

[5. A printer using the laser diode array of claim 1 as a light source.]

[6. An optical communication device using the laser diode array of claim 1 as a light source.]

[7. The laser diode array according to claim 1, wherein a current confinement layer is between the second spacer layer and the second DBR layer.]

[8. The laser diode array according to claim 1, wherein the current: confinement layer comprises a current confinement region that is in a peripheral region of a current injection region.]

*9. A laser diode array comprising:*

*a support substrate that comprises:*

*a support base,*

*a first insulating layer,*

*an adhesive layer, and*

*a metal layer;*

*a columnar-shaped vertical resonator structure on a surface of the metal layer, the columnar-shaped vertical resonator structure comprises:*

*a first contact layer in contact with the surface of the metal layer,*

*a first DBR layer between the first contact layer and a first spacer layer,*

*an active layer between the first spacer layer and a second spacer layer, and*

*a second DBR layer between the second spacer layer and a second contact layer; and*

*an aperture in a second insulating layer, the aperture is configured to expose a portion of the metal layer.*

*10. The laser diode array according to claim 9, wherein the support base comprises silicon.*

*11. The laser diode array according to claim 9, wherein a hole in the support substrate penetrates the support base, the first insulating layer, and an adhesive layer.*

*12. The laser diode array according to claim 11, that further comprises:*

*a connection part that is in the hole and in contact with the metal layer.*

*13. The laser diode array according to claim 9, wherein the columnar-shaped vertical resonator structure that further comprises:*

*a current confinement layer between the second spacer layer and the second DBR layer.*

*14. The laser diode array according to claim 13, wherein a current confinement region of the current confinement layer is in a peripheral region of a current injection region.*

*15. The laser diode array according to claim 9, wherein the columnar-shaped vertical resonator structure that further comprises:*

*a metal electrode wired directly to an electrode pad.*

* * * * *